United States Patent
Suh

(10) Patent No.: US 7,146,456 B2
(45) Date of Patent: Dec. 5, 2006

(54) MEMORY DEVICE WITH A FLEXIBLE REDUCED DENSITY OPTION

(75) Inventor: Jungwon Suh, Apex, NC (US)

(73) Assignee: Infineon Technologies North America Corp., San Jose, CA (US)

( * ) Notice: Subject to any disclaimer, the term of this patent is extended or adjusted under 35 U.S.C. 154(b) by 337 days.

(21) Appl. No.: 10/673,626

(22) Filed: Sep. 29, 2003

(65) Prior Publication Data

US 2005/0071540 A1     Mar. 31, 2005

(51) Int. Cl.
G06F 12/00 (2006.01)
(52) U.S. Cl. .................................... 711/105
(58) Field of Classification Search .................. None
See application file for complete search history.

(56) References Cited

U.S. PATENT DOCUMENTS

| | | | |
|---|---|---|---|
| 5,583,813 A * | 12/1996 | Dosaka et al. | 365/189.01 |
| 6,038,382 A | 3/2000 | Kanazawa | |
| 6,044,029 A * | 3/2000 | Shore | 365/200 |
| 6,078,542 A * | 6/2000 | Tomishima | 365/230.03 |
| 6,519,201 B1 | 2/2003 | Cowles et al. | |
| 6,549,476 B1 | 4/2003 | Pinney | |
| 6,556,497 B1 * | 4/2003 | Cowles et al. | 365/222 |
| 6,567,287 B1 | 5/2003 | Scheuerlein | |
| 6,586,300 B1 | 7/2003 | Hummler et al. | |
| 6,603,694 B1 | 8/2003 | Frankowsky et al. | |
| 6,807,114 B1 * | 10/2004 | Keeth et al. | 365/200 |

OTHER PUBLICATIONS

Ars Technica, LLC webpage entitled " RAM Guide: Part I: DRAM and SRAM Basics—Storage Theory", 5 pgs; available at www.arstechnica.com, Jon "Hannibal" Stokes, © 1998-2003.
Ars Technica, LLC webpage entitled "RAM Guide: Part I: DRAM and SRAM Basics—RAM Chips", 4 pgs; available at www.arstechnica.com, Jon "Hannibal" Stokes, © 1998-2003.
Ars Technica, LLC webpage entitled "RAM Guide: Part I: DRAM and SRAM Basics—RAM chips", 6 pgs; available at www.arstechnica.com, Jon "Hannibal" Stokes, © 1998-2003.
Ars Technica, LLC webpage entilted "Ars Technica RAM Guide Part II: Asynchronous and Synchronous DRAM", 5 pgs; available at www.arstechnica.com, Jon "Hannibal" Stokes, © 1998-2003.
Ars Technica, LLC webpage entitled "Ars Technica RAM Guide, Part III: DDR DRAM and RAMBUS", 5 pgs; available at www.arstechnica.com, Jon "Hannibal" Stokes, © 1998-2003.

* cited by examiner

*Primary Examiner*—Mano Padmanabhan
*Assistant Examiner*—Daniel Ko
(74) *Attorney, Agent, or Firm*—Dicke, Billig & Czaja, PLLC

(57) ABSTRACT

A dynamic random access memory device is capable of converting from a full density memory device to a reduced density memory device. The reduced density memory device compensates for cell failures in a plurality of cell blocks, regardless of the location of the cell failures. The memory device includes a row address mapping fuse for selectively determining row address combinations capable of storing data bits. A row address mapping logic is coupled to the row address mapping fuse and is capable of routing data bits to the address combinations capable of storing data bits.

15 Claims, 2 Drawing Sheets

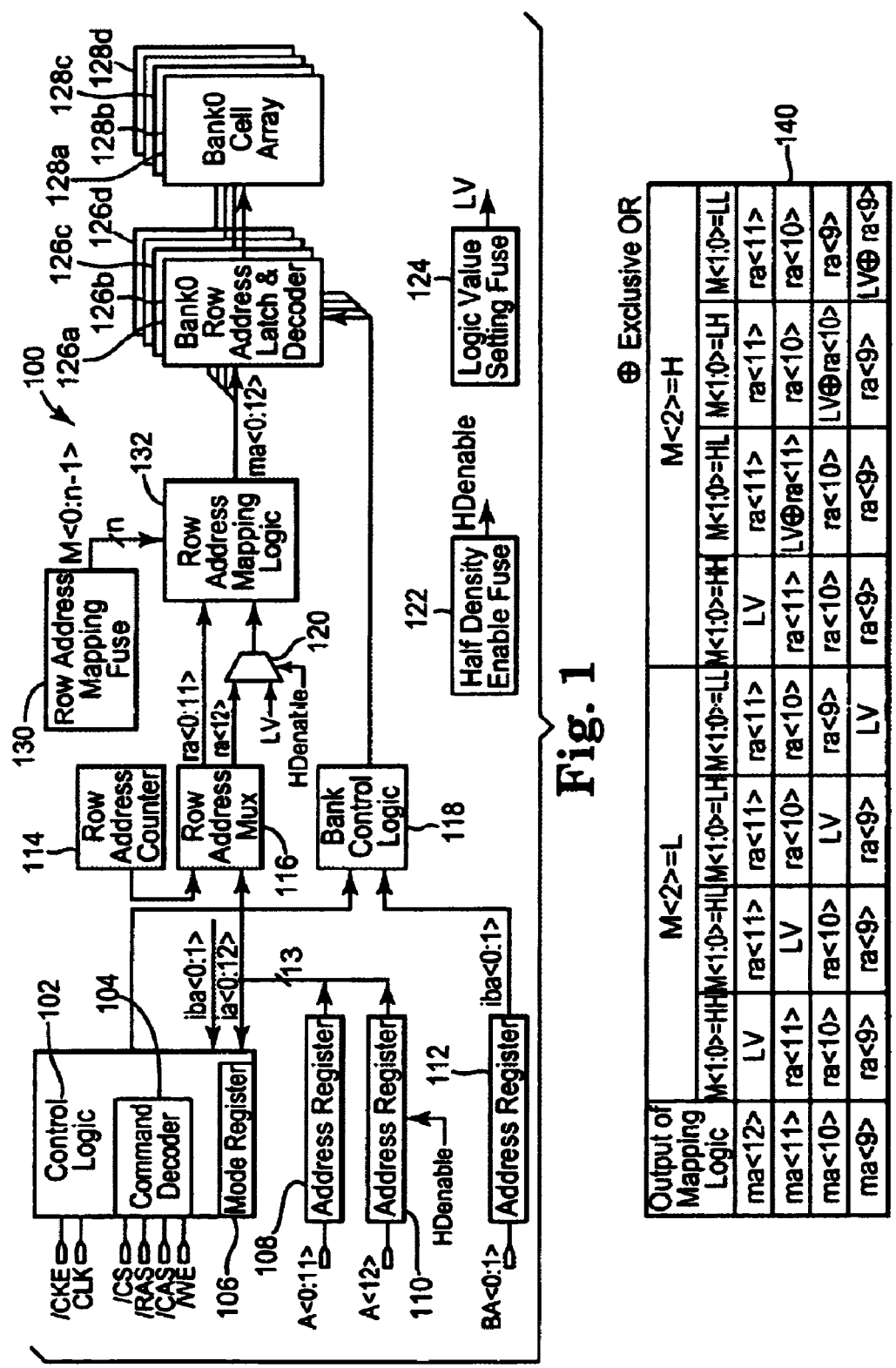

MEMORY DEVICE WITH A FLEXIBLE REDUCED DENSITY OPTION

BACKGROUND

The invention relates generally to dynamic random access memory (DRAM) devices and, more specifically, to a device and method capable of converting a full density memory device to a reduced density memory device, thereby compensating for cell failures in a plurality of cell blocks.

DRAM integrated circuits (ICs) are formed from complimentary metal oxide semiconductors (CMOS) circuits. A DRAM device typically includes millions or billions of individual DRAM memory cells arranged in an array, with each cell storing information in the form of one bit (i.e., a logic 1 or a logic 0) of data. The memory cells are arranged in a matrix of addressable rows and columns, with each row corresponding to a cell block containing a multi-bit word of data. A DRAM memory cell typically includes an access field effect transistor (FET) and a storage capacitor. The access FET allows the transfer of data charges to and from the storage capacitor during reading and writing operations. The bit of data in each cell is stored on the capacitor as a charge, or lack thereof. This data must be refreshed because the charge of the capacitor leaks therefrom over time (i.e., over the charge, or data retention time of the cell). In order to prevent the loss of data, the data storage in the cell must be refreshed before the end of the data retention time.

One problem with conventional high density DRAMs results during a wafer production when many individual memory cells are identified as being defective due to, for example, a shortened memory cell capacitor or an improper electrical connection within the memory cell. DRAM wafers are tested after fabrication to identify defective memory cells. The defective cells are incapable of having data or information stored to or read from that location. It is important to identify defective memory cells prior to programming the DRAM so that no data bits will be stored or attempted to be stored at these locations. Access to a defective memory cell must be redirected to a different memory cell, so that data will be accurately stored within the DRAM.

One solution to the problem of defective cell blocks incorporating defective memory cells adopted by the industry includes utilizing a redundant scheme within a DRAM. The redundant scheme including redundant rows and columns of memory cells to replace the defective memory cells. However, a substantial amount of additional circuitry must be provided to redirect memory access to redundant memory cells. This additional circuitry may be expensive and reduce the overall profitability of the circuitry.

Another approach to solving the defective memory cell problem includes coupling two memory cells in respective rows to the same digit line or different digit lines for a specific column. For example, the memory cell in an even row is coupled to a digit line and the memory cell in an odd row is coupled to a complimentary digit line. If one of the memory cells is defective, the charged from the non-defective memory cell can charge the voltage on the digit line to be detected by the sense amplifier. However, solution permits storage of data into memory cells by initially reducing the capacity of a memory array to 50 percent. In addition, if both of the corresponding memory cells are defective, the data stored in those memory cells will be lost and the reliability of the DRAM will be compromised.

In some instances, a particular DRAM is not repairable with the redundant row and column scheme due to a large number of defective memory cells within various rows or cell blocks. The most widely used solution in the industry to the problem of too many defective memory cells is the conventional approach of converting a full density memory device to a perfect half memory density device. This conventional solution is inflexible in that it simply recognizes a defective cell block having defective memory cells and essentially reduces each bank of memory by 50 percent. Assuming a 256 mega bit memory device, each bank having 64 mega bit density and each bank consisting of 16 cell blocks, this solution utilizes either the top half portion of a bank from cell block 0 to cell block 7 or the bottom half portion of the bank from cell block 8 to cell block 15.

This conventional half density option has severe limitations in converting an irreparable full density memory device to a perfect half density memory device. For example, in the situation in which any one of the cell blocks between cell block 0 to cell block 7 of a particularly bank has cell failures and any one of the cell blocks between cell block 8 to cell block 15 of the same bank has memory cell failures, the half density conversion fails for that bank. The perfect half density option is incapable of providing an alternate location for all defective cells. Neither the top half portion nor the bottom half portion can be utilized and information cannot be stored anywhere within the particular bank. This solution is inflexible in that it cannot accommodate cell failures on opposite halves (top half and bottom half) of the bank.

SUMMARY

A dynamic random access memory device is capable of converting from a full density memory device to a reduced density memory device. The reduced density memory device may compensate for cell failures in a plurality of cell blocks, regardless of the locations of the cell failures. The memory device includes a row address mapping fuse for selectively determining row address combinations capable of storing data bits. A row address mapping logic is coupled to the row address mapping fuse and is capable of routing data bits to the address combinations capable of storing data bits.

BRIEF DESCRIPTION OF THE DRAWINGS

FIG. 1 is a partial, functional block diagram of a DRAM according to the present invention.

FIG. 2 is a truth table for a portion of a bank in accordance with the present invention.

DETAILED DESCRIPTION

Figures 3, 4:
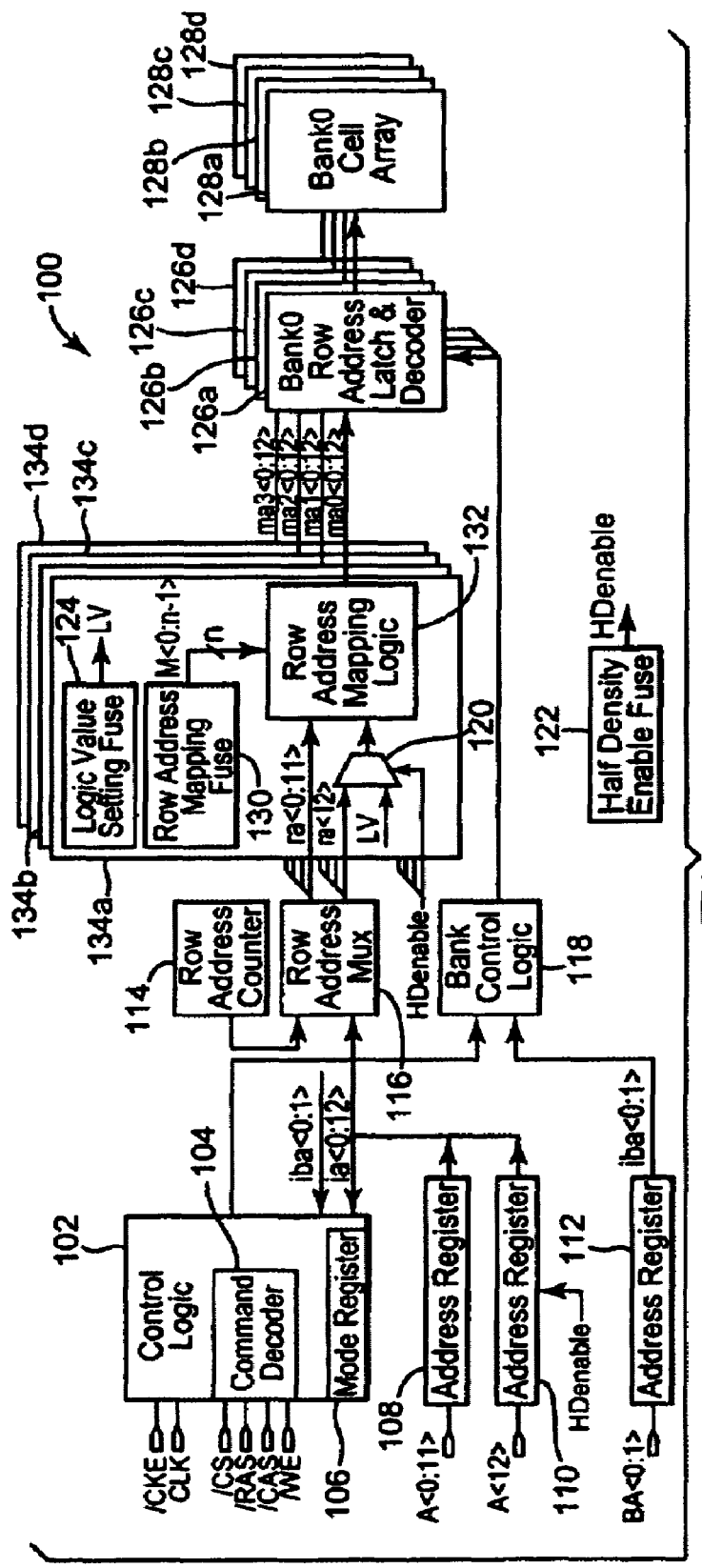
FIG. 3 is a selection table illustrating possible cell block selections according to the present invention.
FIG. 4 is a partial, functional block diagram of a DRAM according to the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Prior art half density technology employs identifying a defective cell block or row of data having defective cells and utilizing one-half of the cell blocks of the DRAM, excluding the defective cell blocks. However, the prior technology is inflexible in that it cannot flexibly and selectively choose the cell blocks capable of storing information. Rather, prior DRAM technology employs only utilizing either the top half or the bottom half of the cell blocks within a bank of a DRAM. For example, in a bank consisting of 16 cell blocks, either cell blocks 0–7 may be chosen to store information or cell blocks 8–15 may be chosen to store information. No flexible selective combination of cell blocks may be chosen to store information.

FIG. 1 is a partial, functional block diagram of DRAM 100 in accordance with the present invention. DRAM 100 includes control logic 102 having command decoder 104 and mode register 106, address registers 108 and 110, bank address register 112, row address counter 114, row address multiplexer 116, bank control logic 118, multiplexer 120, half density enable fuse 122, logic value setting fuse 124, bank 0–3 row address latch and decoder 126a, 126b, 126c, and 126d, bank 0–3 cell array 128a, 128b, 128c, and 128d, row address mapping fuse 130, and row address mapping logic 132. DRAM 100 does not include other circuitry such as refresh circuitry or column circuitry, for clarity purposes. It is understood by those in the art that in addition to the circuitry shown in FIG. 1, data circuitry and column circuitry would be required for a functional DRAM. DRAM 100 represents a 256-mega bit memory device. However, it is understood that DRAM 100 may also represent other storage capacity DRAMs, such as 64-mega bits, 128-mega bits, 512-mega bits, or 1-giga bit.

Control logic 102 and command decoder 104 are capable of receiving several signals, including clock enable signal CKE, clock signal CLK, chip select CS, row address strobe signal RAS, column address strobe signal CAS, and write enable signal WE. Various combinations of these command signals correspond to respective memory commands, such as active, read, write, precharge, etc. Command decoder 104 generates control signals corresponding to the memory commands, including a read command and a write command, as well as bank active commands and precharge commands.

Address registers 108 and 110 operate to latch in a first plurality of address bits such that address register 108 latches in address bits A <0:11>, while address register 110 latches in address bit A<12>. It is understood by those in the art that address register 108 may further be defined as a plurality of address registers such that a single address bit is latched into each address register, similar to address register 110. Address register 108 outputs internal row address signals ia<0:11> corresponding to the inputted address bits. Similarly, address register 110 outputs internal row address signal ia<12> that corresponds to the inputted address bit. Address register 112 is a bank address register which latches a bank address bit, such as BA<0> or BA<1>. Bank address register 112 outputs an internal bank address bit, such as iba<0> or iba<1>.

Row address counter 114 is a counter that provides an input to row address multiplexer 116 during refresh operations. Row address multiplexer 116 also receives various internal row addresses from address registers 108 and 110, specifically internal row address signals ia<0:12>. Bank control logic 118 receives several signals from control logic 102 and also receives internal bank address signals iba<0: 1>. Bank control logic 118 also provides outputs to bank 0 row address latch and decoder 126, bank 1 row address latch and decoder 126b, bank 2 row address latch and decoder 126c, and bank 3 row address latch and decoder 126d, thereby selecting the particular bank of cell blocks at which information will be stored.

DRAM 100 includes a flexible, reduced density option capable of selecting any combination of cell blocks for data storage in a reduced density mode, regardless of the location of cell block failures. It is understood that a reduced density option may indicate a half density option, or may indicate a density option having less density than a full density option, but more or less density than a halt density option. The flexible reduced density option is implemented via various components and connections, including multiplexer 120, half density enable fuse 122, logic value setting fuse 124, row address mapping fuse 130, and row address mapping logic 132.

Multiplexer 120 receives half density enable (HDenable) signal from half density enable fuse 122. HDenable signal represents a selection as to whether DRAM 100 is operating in a full density mode or a half density mode. For example, if the HDenable signal is a low signal or a logic 0, indicating a full density mode, row address signal ra<12> would be the output signal from multiplexer 120 and DRAM 100 would store data bits or information at every cell block location within DRAM 100. Conversely, if the HDenable signal is a high signal or a logic 1, logic value signal LV would be the output of multiplexer 120; thereby indicating that DRAM 100 is operated in a half density mode. It is understood by those in the art that the designation of high and low signals and the logic 1 and logic 0 may be interchanged, depending on the exact circuitry of the DRAM, and are not intended to be limiting.

Row address mapping fuse 130 receives information relating to defective cells or cell blocks identified during a testing procedure of DRAM 100. Row address mapping fuse 130 is electrically coupled to row address mapping logic 132 and provides row mapping signals M<0:n−1> to row address mapping logic 132, where n is related to the number of cell blocks in a particular bank. For example, n equals 3 in a 256-mega bit DRAM, such as DRAM 100, indicating that there are four cell blocks in each of banks 0–3 126a–126d.

Row address mapping fuse 130 selectively and flexibly determines combinations void of cell failures and capable of storing data bits. Row address mapping use 130 supplies row mapping signals M0–M15 to row address mapping logic 132 representative of possible row address combinations for information storage. Row address mapping logic 132 is electrically coupled between row address multiplexer 116, multiplexer 120, bank 0 row address latch and decoder 126a, bank 1 row address latch and decoder 126b, bank 2 row address latch and decoder 126c, and bank 3 row address latch and decoder 126d. Row address mapping fuse 130 and row address mapping logic 132 transform row address signal ra<0:11> and either row address signal ra<12> or logic value LV into mapping address signals ma<0:12> as described below. Row address mapping logic 132 routes specific data bits to the address combinations capable of storing data bits within bank 0–3 cell array 128a–128d via bank 0–3 row address latch and decoder 126a–126d.

In one example, DRAM 100 is a 256 mega bit DRAM device having 16 cell blocks in each of banks 0–3 126a–126d. In this example, the cell block defined by row address signal ra<12> is defective. Therefore, HDenable provides a signal to multiplexer 120 indicating that DRAM 100 is operating in the flexible reduced density option. Multiplexer 120 thereby replaces row address signal ra<12> with logic value LV. Therefore, since the cell block defined with row address signal ra<12> is defective, the location to store a bit of information is altered away from row address signal ra<12> by interposing logic value LV for row address signal ra<12>. While the example shown and described with reference to FIG. 1 discusses cell block failures only at row address signal ra<12>, it is understood that this is for illustrative purposes only and that cell failures in any row address signals ra<0:12> may be rectified and redirected by the present invention and should not be considered limiting.

The present invention shown in FIG. 1 provides that DRAM 100 includes row address mapping logic 132 between multiplexer 120 and several bank 0–3 row address latch and decoder banks 126a, 126b, 126c, and 126d to facilitate flexibility for the reduced density conversion. Row address mapping logic 132 receives various signals, including row address signals ra<0:11>, logic value LV, and possible mapping address signals M<0:n-1>. The output signals from row address mapping fuse 130, m<0:n-1>, enables row address mapping logic 132 to redirect a bit of information to be stored from defective row address signal ra<12> to an operational mapping address signal ma<12>.

In one embodiment, row address mapping logic 132 includes and utilizes a mapping truth table stored in memory. The mapping truth table includes various combinations of cell blocks addresses as determined by row address mapping use 130. One example of a mapping truth table for the row address mapping logic 132 as determined by row address mapping fuse 130 is truth table 140 shown in FIG. 2. In the mapping truth table example shown in FIG. 2, mapping address signals ma<0:8> are the same as row address ra<0:8>, and only mapping address signals ma<9:12> are the output of some combination between row address signals ra<9:12> and logic value LV, as determined by row address mapping use 130. Assuming a 256-mega bit memory device, it is reasonable to map row address signals ra<9:12> into mapping address signals ma<9:12> like that shown in FIG. 2. Row address mapping signals M<0:n-1> require n to equal 3 to cover any combination of cell blocks to which information may be routed and stored.

FIG. 3 illustrates selection table 142 showing possible cell block selections according to one example utilizing the present invention. Selection table 142 of FIG. 3 specifically defines the selected locations of 16 cell blocks in a bank to which information may be written for the present example. The location of cell blocks to which information may be written may be flexibly selected based upon three row address mapping signals M<2:0> each being high H or low L, as well as logic value LV being high H or low L. For example, in the case where cell block 7 and cell block 8 have cell failures, one solution provides activating HDenable, and M<2:0> and logic value LV are set to "HHL" and "L", respectively. These signals will select cell blocks 0, 1, 2, 3, 12, 13, 14, and 15 for storage of information, and will exclude failed cell blocks 7 and 8, as well as cell blocks 4, 5, 6, 9, 10, and 11. Another solution provides activating HDenable, and M<2:0> and logic value LV are set to HLH and H, respectively. These signals will select cell blocks 2, 3, 4, 5, 10, 11, 12, 13 for storage of information, and will exclude failed cell blocks 7 and 8, as well as cell blocks 1, 6, 9, 14, 15, and 16. Yet another solution provides activating HDenable and M<2:0> and logic value LV are set to HLL and H, respectively. These signals will select cell blocks 1, 2, 5, 6, 9, 10, 13, and 14 for storage of information, and will exclude failed cell blocks 7 and 8, as well as cell blocks 3, 4, 11, 12, 15, and 16. The implementation of row address mapping logic 132 can be designed with standard CMOS logic. It is understood that the example shown in FIG. 2 is only one of several solutions that may be implemented using the circuitry and design of the present invention. Other solutions may be utilized by choosing appropriate alternate values for HDenable, logic value LV, and mapping signals m<0:n-1>.

Once again, it is understood that the example shown in FIG. 3 is only one of several solutions to a specific instance of cell block failures that may be implemented using the circuitry and design of the present invention. Other solutions may be utilized by choosing appropriate alternate values for logic value LV and mapping signals m<0:n-1>. As shown in the selection table in FIG. 3, any cell block having a defective cell may be avoided in a flexible manner. In addition, if there are two or more defective cell blocks, the defective cell blocks can be flexibly and effectively avoided such that no data bits or information are stored at the defective cell blocks.

FIG. 4 is a partial, functional block diagram of DRAM 100 according to the present invention. DRAM 100 shown in FIG. 4 is similar to DRAM 100 shown in FIG. 1, and further includes a plurality of mapping circuits 134a, 134b, 134c, and 134d. Each of the mapping circuits include the elements necessary to provide a flexible reduced density option, including a multiplexer, a logic value setting fuse, a row address mapping fuse, and a row address mapping logic. FIG. 4 also includes a plurality of bank 0–3 row address latch and decoders 126a, 126b, 126c, and 126d and a plurality of bank cell arrays 128a, 128b, 128c, and 128d. The additional circuitry of DRAM 100 shown in FIG. 4 provides another layer of flexibility in determining the location of cell blocks to which information may be stored. Each mapping circuit 134a–134d is associated and provides mapping address signals to an associated bank 0–3 row address latch and decoder 126a–126d and an associated bank 0–3 cell array 128a–128d. Therefore, each bank cell array is individually mapped to eliminate the particular defect cell block(s) of the given cell block array without effecting or altering other cell block arrays. For example, identified cell blocks may be flexibly avoided within a single cell block array, while other identified failed cell blocks may be flexibly avoided within another cell block array, each solution being performed independent of any other cell block solution. Functional storage locations may be flexibly and selectively chosen within a particular bank, independent of other banks.

The present invention provides a flexible reduced density option for a DRAM having multiple cell block failures within a bank. The reduced density option of the present invention provides means for flexibly and selectively choosing locations of cells capable of storing information.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A dynamic random access memory device capable of converting from a full density memory device to a reduced density memory device to compensate for cell failures in a plurality of cell blocks, the memory device comprising:
   a row address mapping fuse for selectively determining row address combinations void of cell failures and capable of storing data bits;
   row address mapping logic coupled to the row address mapping fuse for receiving a row address mapping signal from the row address mapping fuse and receiving row address signals and for routing specific data bits to the row address combinations void of cell failures and capable of storing the data bits;
   a reduced density enable signal for switching the memory device between a full density mode and a reduced density mode;
   a logic value setting signal;
   a multiplexer having a first input coupled to the reduced density enable signal, a second input coupled to the logic value setting signal, and a third input coupled to a row address; and
   wherein an output signal of the multiplexer is coupled to an input of the row address mapping logic.

2. The dynamic random access memory device of claim 1, wherein the row address mapping logic receives a plurality of row address signals from a row address multiplexer and the output signal of the multiplexer.

3. The dynamic random access memory device of claim 1, wherein the output signal of the multiplexer is the logic value setting signal when the memory device is operating in the reduced density mode.

4. The dynamic random access memory device of claim 1, wherein the output signal of the multiplexer is the row address when the memory device is operating in the full density mode.

5. The dynamic random access memory device of claim 1, and further comprising:
   a plurality of row address mapping fuses;
   a plurality of row address mapping logics;
   a plurality of bank cell arrays; and
   wherein an output of each row address mapping logic is coupled to a corresponding input of a bank cell array such that data bits may be routed to row address combinations void of cell failures and capable of storing the data bits within the particular bank cell array independent of other bank cell arrays.

6. The dynamic random access memory device of claim 1, wherein the row address mapping logic utilizes a selection table defining selected locations void of cell failures and capable of storing the data bits.

7. A method of converting a full density memory device to a reduced density memory device, the method comprising:
   selectively determining a reduced density address combination having addresses which omit cell blocks having cell block failures; and
   storing data bits at an address within the reduced density address combination by replacing a row address signal with a logic value signal such that a data bit is stored at a cell block void of errors.

8. The method of claim 7, and further comprising:
   switching the memory device between a full density mode and a reduced density mode.

9. The method of claim 7, wherein the step of selectively determining a reduced density address combination further comprises:
   selectively determining a plurality of addresses which avoid cell blocks having cell block failures.

10. The method of claim 7, wherein the step of selectively determining a reduced density address combination further comprises:
    defining selected locations of a cell block array to which information may be stored without error.

11. The method of claim 7, wherein the step of selectively determining a reduced density address combination further comprises:
    selectively determining a reduced density address combination based upon a row address mapping signal in combination with a logic value signal.

12. A memory device capable of converting from a full density memory device to a reduced density memory device to compensate for cell failures in a plurality of cell blocks, the memory device comprising:
    means for determining address combinations capable of storing data bits and void of cell block failures;
    means for routing data bits to the address combinations capable of storing the data bits; and
    means for replacing an address register signal with a logic value signal.

13. The memory device of claim 12, and further comprising:
    means for switching the memory device between a full density mode and a reduced density mode.

14. The memory device of claim 12, wherein the means for determining address combinations further comprises:
    means for selectively determining address combinations capable of storing data bits based upon a mapping truth table.

15. A dynamic random access memory device capable of converting from a full density memory device to a half density memory device to compensate for cell failures in a plurality of cell blocks, the memory device comprising:
    control logic;
    a command decoder for bank active, precharge, read and write commands;
    a plurality of address registers;
    a row address counter;
    a row address multiplexer having an input coupled to an output of the row address counter and having a plurality of inputs coupled to the plurality of address registers for receiving a plurality of address signals;
    a bank control logic having an input coupled to the control logic and having an input coupled to a bank address register for receiving a bank address signal;
    a half density enable fuse for providing a half density enable signal for switching the memory device between a full density mode and a half density mode;
    a logic value setting fuse for providing a logic value setting signal;
    a multiplexer having a first input coupled to an output of the row address multiplexer, a second input coupled to an output of the logic value setting fuse for receiving the logic value setting signal, and a third input coupled to an output of the half density enable fuse for receiving the half density enable signal;
    a row address mapping fuse for providing selectively determining address combinations void of cell failures and for providing a row address mapping signal;

row address mapping logic having a first input coupled to an output of the row address mapping fuse for receiving the row address mapping signal, a second input coupled to the output of the multiplexer, and a plurality of inputs electrically coupled to a plurality of outputs of the row address multiplexer;

a bank row address latch and decoder having a first input coupled to an output of the row address mapping logic and having a second input coupled to an output of the bank control logic; and a bank cell array having an input coupled to an output of the bank row address latch and decoder.

* * * * *